United States Patent [19]

Ooiwa et al.

[11] Patent Number: 4,891,118

[45] Date of Patent: Jan. 2, 1990

[54] PLASMA PROCESSING APPARATUS

[75] Inventors: Kiyoshi Ooiwa, Yokosuka; Masahiko Doki, Sagamihara, both of Japan

[73] Assignee: Fuji Electric Co., Ltd., Kawasaki, Japan

[21] Appl. No.: 275,352

[22] Filed: Nov. 23, 1988

[30] Foreign Application Priority Data

Nov. 25, 1987 [JP] Japan .................................. 62-296312
Oct. 31, 1988 [JP] Japan .................................. 63-275786

[51] Int. Cl.$^4$ ............................................. H01H 1/46
[52] U.S. Cl. .................................... 204/298; 156/345; 156/643; 118/723; 204/192.32
[58] Field of Search ............... 204/192.32, 298 EP, 204/298 MW; 156/345, 643; 118/723; 427/38-39

[56] References Cited

U.S. PATENT DOCUMENTS

| 4,316,791 | 2/1982 | Taillet ................... | 204/298 |
| 4,581,100 | 4/1986 | Hatzakis et al. .......... | 156/643 |
| 4,705,595 | 11/1987 | Okudaira et al. ......... | 156/643 |
| 4,776,918 | 10/1988 | Otsubo et al. ........... | 156/345 |
| 4,795,529 | 1/1989 | Kawasaki et al. ......... | 156/643 |
| 4,808,258 | 2/1989 | Otsubo et al. ........... | 156/643 |

Primary Examiner—Aaron Weisstuch
Attorney, Agent, or Firm—Brumbaugh, Graves, Donohue & Raymond

[57] ABSTRACT

In a typical plasma processing apparatus, microwaves are generated into a processing chamber which contains a gas and a substrate. Magnetic fields transmitted into the processing chamber cause plasma to be produced when microwaves are generated. Typically an RF bias voltage is applied to the substrate during the process. By optimizing the RF bias voltage which the pulses of microwaves the apparatus produces a higher quality thin film, or etching process, without damaging the substrate surface.

3 Claims, 3 Drawing Sheets

PLASMA PROCESSING APPARATUS

BACKGROUND OF THE INVENTION

The present invention generally relates to a microwave plasma processing apparatus for use in the manufacturing of a semiconductor device, which is capable of forming a thin film by CVD (Chemical Vapor Deposition), and dry etching, which utilizes microwave plasma and, more particularly, a plasma processing apparatus which applies an optimal RF bias voltage to a substrate to be processed.

DESCRIPTION OF THE PRIOR ART

A processing technique which employs ECR (Electron Cycrotron Resonance) plasma has attracted much attention. The ECR plasma is based on the principle that electrons are accelerated by making use of resonance effects created between a magnetic field and microwaves. The kinetic energy of the electrons ionizes a gas thereby generating the plasma. The electrons, excited by the microwaves, revolve around the lines of magnetic force. When the centrifugal force is in equilibrium with the Lorentz force an ECR condition exists. If $mr\omega^2$ represents the centrifugal force, and the Lorentz force is $-qrt\omega B$, then their equilibrium is expressed as $\omega/B = q/m$, where $\omega$ is the angular frequency of the microwave, B is the density of magnetic flux and q/m is the specific charge. A commonly used industrially certified frequency for microwaves is 2.45 GHz. In this case, the resonance magnetic flux density is 875 gausses.

In order for an ECR plasma etching/CVD apparatus to form a thin film, or perform an efficient etching, a high density of plasma can be created by transforming the microwaves into pulses having a large peak power. Commonly an RF (Radio Frequency) bias voltage is applied between the plasma and the substrate to be processed, in order to facilitate a highly anisotropic etching process. Note, that RF refers to a high frequency ranging from approximately 100 KHz to several tens of MHz.

In an etching process, grooves and holes formed in the surface of the substrate can be embedded uniformly within a highly dense film by applying the RF bias voltage when forming the thin film. In addition, stepped portions formed on the substrate surface can be levelled because, as is commonly known, applying the RF bias voltage produces electric fields in both the vertical and lateral directions of the substrate. This concentration of electric fields acts on the formation of the thin film, and facilitates the scraping of pointed portions on the substrate surface.

In FIG. 5, there is illustrated an example of the typical ECR plasma etching/CVD apparatus. Focusing on the general configuration and function of this apparatus, a vacuum is created in plasma generating chamber 3 and a processing chamber 9 by a suitable evacuating means (not shown). Nitrogen gas is made to flow from gas a supplying means 4 into the plasma generating chamber 3, at which time the pulse microwaves generated by a microwave generator 17 are introduced, via a waveguide means 1, into the plasma generating chamber 3. Between the plasma generating chamber 3 and the waveguide 1 is a vacuum window 2 for isolating, in an airtight manner, the evacuated plasma generating chamber 3 from the waveguide 1, which is at atmospheric pressure. The lower portion of the plasma generating chamber 3 is fitted with a metallic plate, formed with a large diameter central opening. The metallic plate and the plasma generating chamber 3 are combined to constitute a half-open microwave resonator. Disposed outside the resonator is an excitation solenoid 6 by which magnetic fields satisfying ECR conditions are produced in the resonator. As a result, plasma is generated in the resonator, forced out and transferred along the lines of magnetic force into the processing chamber 9. Typically, monosilane gas ($SiH_4$) is fed from gas supplying means 12 into a space extending to a substrate board 10. When this gas reacts with the plasma, an active species is formed on the substrate 11. A thin film is formed on the substrate surface. When an RF bias voltage is applied from the RF generator 20 to the substrate. The peripheral surface of the substrate 11, and the wire for applying the RF bias voltage to the substrate 11 are both covered with a shield at ground potential.

The ECR plasma etching/CVD apparatus can be used for etching of the substrate by feeding a gas suitable for etching from the gas supply means 4 instead of nitrogen.

There are, however, problems inherent in this type of conventional ECR plasma etching/CVD apparatus. Specifically, plasma is generated only when the microwaves are introduced into the plasma generating chamber. Hence, between intervals of microwave pulse cycles no microwaves are generated and, therefore, no plasma is produced. If the RF bias voltage is applied, the plasma becomes a load during the occurrence of plasma, and a change in impedance results. However, between pulse cycles when no microwaves or plasma is generated a zero load state is created, and the impedance cannot be matched. If the RF bias voltage is preset to match a certain impedance during the occurrence of plasma, the impedance is inevitably mismatched when producing no plasma, thereby applying a high voltage on the substrate. This high voltage is in some cases approximately 1 KV, and electric discharge takes place on the substrate surface. As a result, there arises a problem in which craters are formed in the substrate surface and the breakage is caused.

Accordingly, it is a primary object of the present invention to provide a plasma processing apparatus which is capable of creating a thin film, or performing an etching process, and which eliminates the above-described problems incidental to the prior art. This can be achieved by applying an optimal RF bias voltage to the substrate either during the etching process or during the formation of thin film. This invention enables the substrate surface to be relatively free of crater and breakage.

SUMMARY OF THE INVENTION

To obviate the foregoing problems, the plasma processing apparatus according to the present invention produces a substrate surface relatively free of craters and breakage. The apparatus includes a plasma-generating chamber having openings at opposite ends, a microwave generator for producing pulsed microwaves, a waveguide means for transferring the microwaves through an opening at one end of the chamber, an excitation solenoid surrounding the chamber for generating a magnetic flux by which to produce active atoms, molecules or ions, a means for supplying gas to said plasma generating chamber, a processing chamber communicating with the plasma-generating chamber via the opening at the other end of the plasma chamber and having means for supporting a substrate on which a thin film is formed, or the surface of which is etched by the active atoms, molecules or ions flowing out of the opening along the lines of magnetic force, an RF generator for applying RF bias to the substrate, and an evacuating system for evacuating the plasma generating chamber and the processing chamber, and an RF generation optimizing means for applying an RF bias voltage to the substrate during periods when said microwave pulses are generated, and for maintaining the voltage of the substrate below a predetermined threshold level during the intervals between said microwave pulses. Therefore it is now possible to form a thin film, or perform an etching process without damaging the substrate.

According to the present invention, it is possible to prevent a high voltage from being generated on the substrate surface by applying the RF bias voltage only when microwaves are introduced into the plasma generating chamber, i.e. only when plasma is generated. The RF generator is pulse-modulated and synchronized with the pulse ON-timing of the microwaves. The RF bias voltage is applied to the substrate at the ON-timing of the microwaves, i.e., only when microwaves are transmitted and plasma is generated. At an OFF-timing of the microwaves, however, no RF bias voltage is applied to the substrate. This arrangement permits the RF bias voltage to be applied against a substantially constant impedance with the plasma serving as a load. Consequently, there is no possibility of an electric discharge due to the high voltage generated on the substrate surface. Hence, it is feasible to perform the plasma processing on the substrate by applying constantly optimal RF bias voltage without damaging the substrate surface.

DESCRIPTION OF THE PREFERRED EMBODIMENTS

Figure 1:
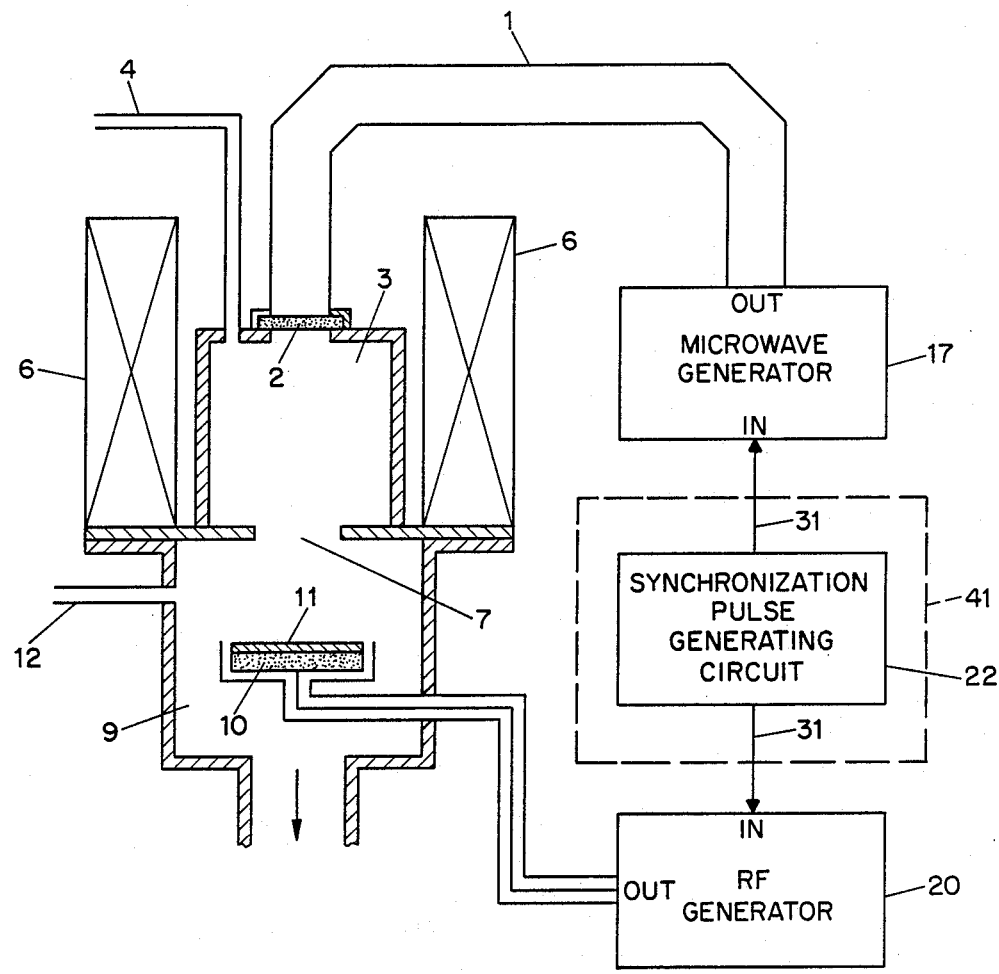
FIG. 1 is a schematic illustration of a plasma processing apparatus equipped with the RF generation optimizing means comprising a synchronization pulse generating circuit or the like, illustrating one embodiment of the present invention.
Figure 2:
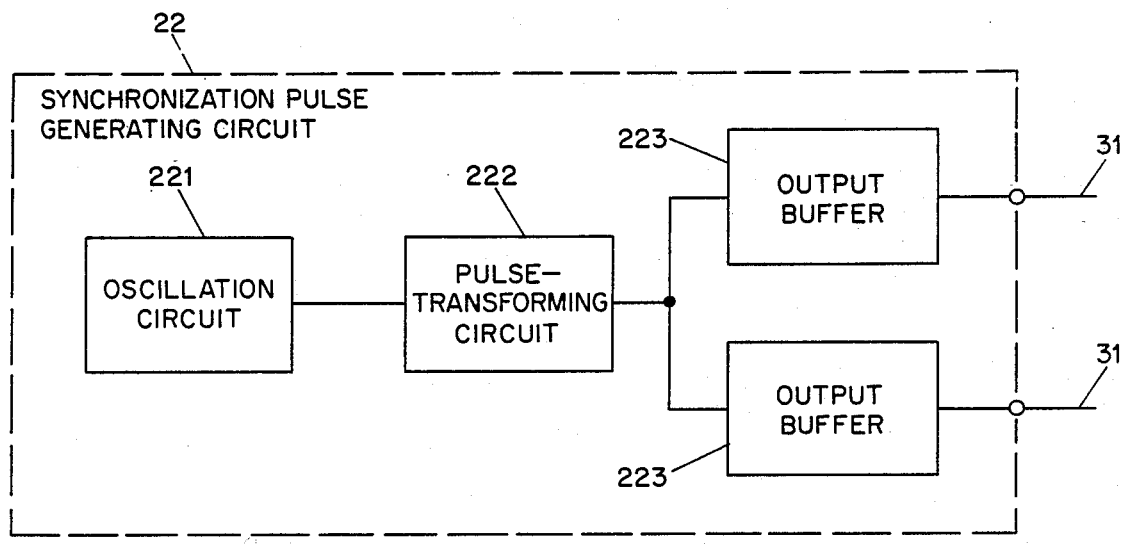
FIG. 2 is a block diagram depicting a constitution of the synchronization pulse generating circuit.
Figure 5:
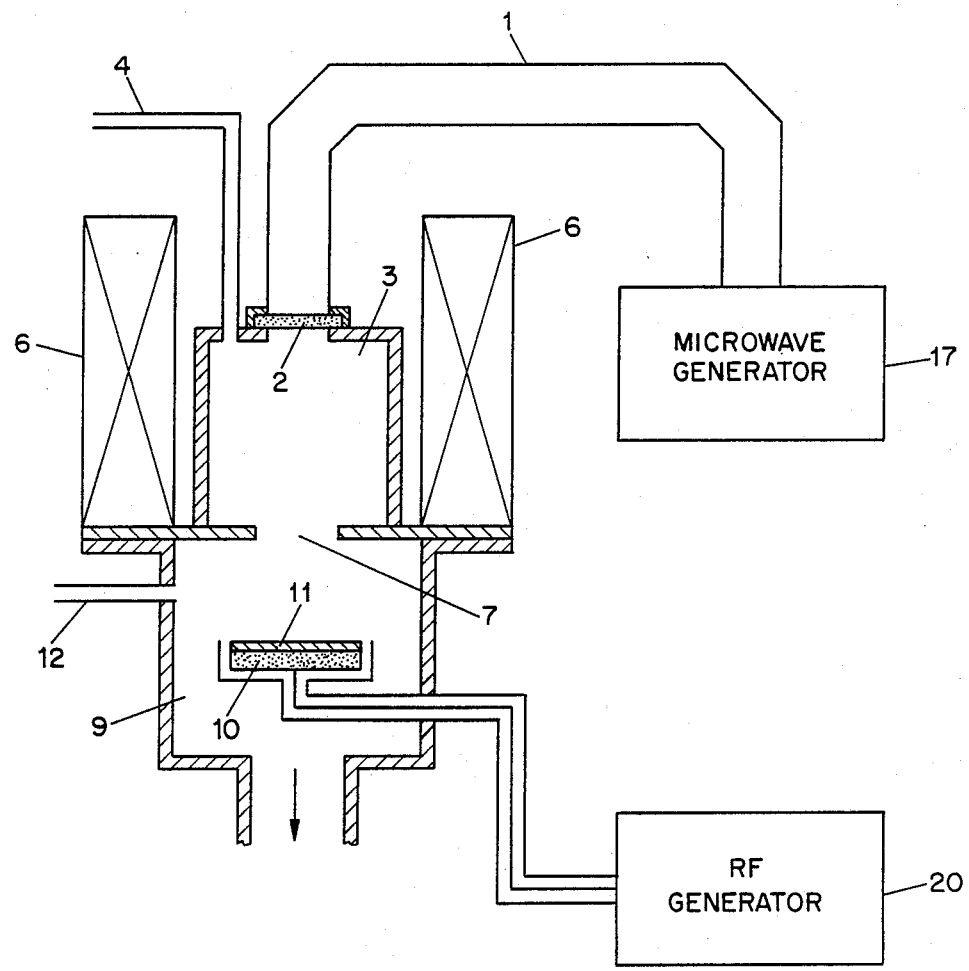
FIG. 5 is a schematic illustration depicting a prior art RF bias applying type plasma-processing apparatus.

Referring first to FIG. 1, there is illustrated a preferred embodiment of an ECR plasma etching/CVD apparatus conceived as a plasma-processing apparatus constructed in accordance with the present invention. The same components as those depicted in an example of the conventional constitution of FIG. 5 are marked with the like numerals, and description thereof is therefore omitted. In FIG. 1, RF generation optimizing means 41 for regulating the timing at which pulse-like microwaves are generated with that of RF waves includes a synchronization pulse-generating circuit 22 and pulse signal transmitting means 31. FIG. 2 is a block diagram illustrating a synchronization pulse-generating circuit 22. An oscillation circuit 221 serves to generate an alternating current at a frequency of 100 Hz or thereabouts. The alternating current is transformed into rectangular waves by means of a pulse-transforming circuit 222. The rectangular waves are transmitted by pulse signal transmitting means 31 via an output buffer 223, having a current amplifying function and comprising operational amplifiers and Integrated Circuitry, to a microwave generator 17 and to an RF generator 20, where pulse modulation is effected thereon. As a result, the microwaves and the RF bias voltage are simultaneously outputted and the ON/OFF process of the microwaves is synchronized with the ON/OFF process of the RF waves. As a result, the RF bias voltage can be applied in synchronism with the occurrence of plasma.

Figure 3:
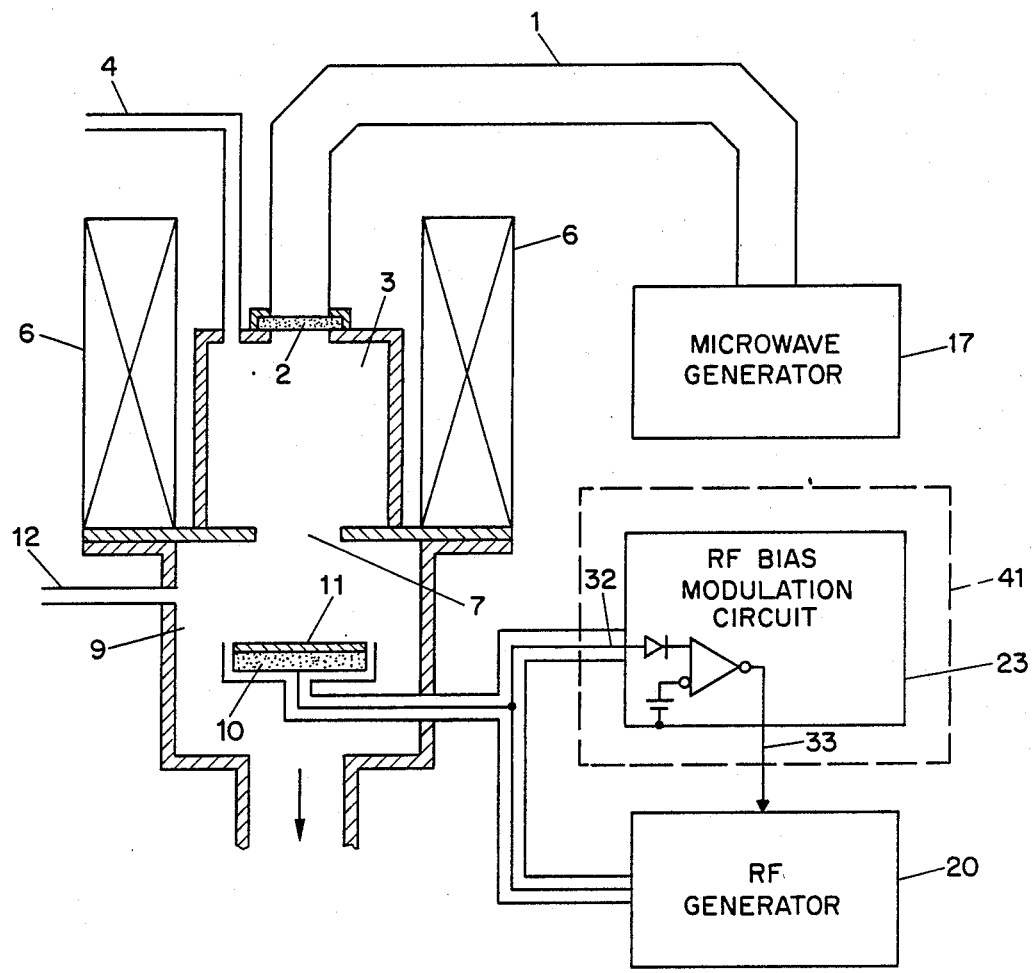
FIG. 3 is a schematic illustration of the plasma processing apparatus equipped with the RF generation optimizing means comprising an RF bias modulation circuit or the like, illustrating another embodiment of the present invention.
Figure 4:
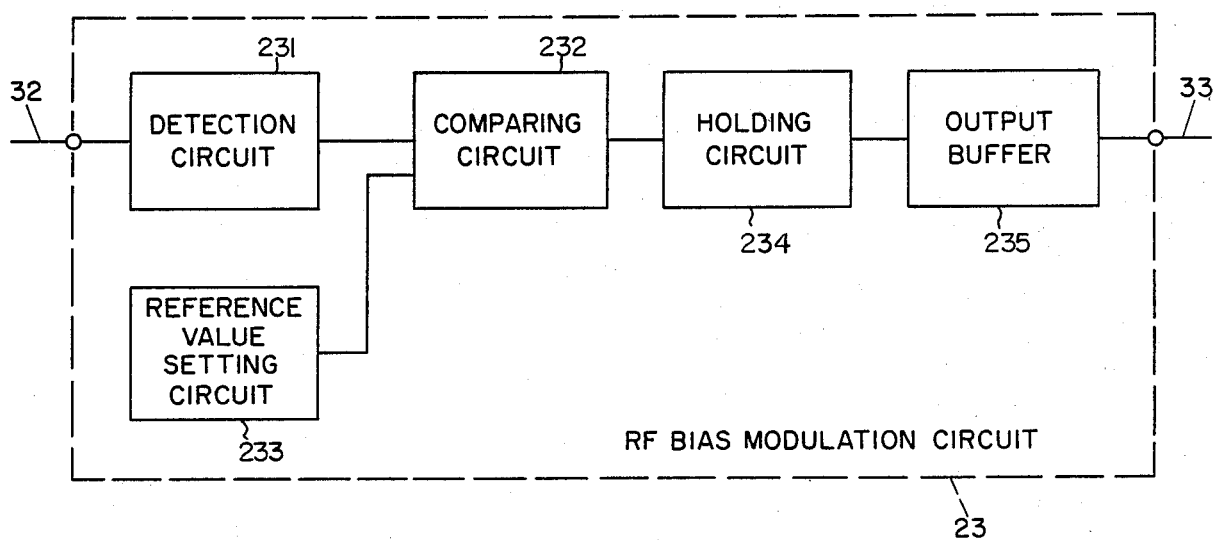
FIG. 4 is a block diagram showing a constitution of the RF bias modulation circuit.

FIG. 3 shows another embodiment of the present invention. In this embodiment, an RF bias modulation circuit 23 provides for pulse modulation by allowing the RF waves to be turned OFF when the electric potential on the substrate exceeds a preset threshold voltage during an OFF-timing of the microwaves. In this case, the RF generation optimizing mean 41 for regulating the generation timing of the pulselike microwaves with that of the RF waves comprises substrate potential detecting means 32, an RF bias modulation circuit 23 and an RF ON/OFF transferring means 33. Referring to FIG. 4, there is depicted a block diagram of an RF bias modulation circuit 23. A voltage generated on the substrate is detected by substrate potential detecting means 32 and is then converted into a DC signal by a detection circuit 231. Thereafter, a comparing circuit 232 compares the DC signal with a value previously set by a reference value setting circuit 233. If the corresponding peak value is smaller than the reference value, an ON-signal is outputted from the comparing circuit 232 and is current-amplified by an output buffer 235, thereby outputting an RF modulation signal while, on the other hand, if a peak value is larger than the reference value, an OFF-signal is outputted from the comparing circuit 232. In order to prevent chattering, however, a holding circuit 234 holds the output signal from the comparing circuit 232 in an OFF-state so as not to output the RF modulation signal for a predetermined period of time, which is shorter than a pulse cycle of the microwaves. Thus, the RF modulation signal is outputted from the RF bias modulation circuit 23 only when the voltage on the substrate is lower than the preset value. Subsequently, the RF modulation signal is inputted via RF ON/OFF transferring means 33 to the RF generator 20, whereby the RF bias voltage is outputted. The RF bias voltage applied to a substrate is smaller than above described threshold voltage when the plasma is being generated and is limited to the threshold voltage even for the increase due to the impedance mismatching immediately after the plasma has disappeared. For this reason, no discharge takes place on the substrate surface. Therefore, the plasma processing can be effected on the substrate by applying an RF bias voltage without imparting any signal to the microwave generator 17.

We claim:
1. A plasma processing apparatus comprising:
   a cylindrical plasma generating chamber having openings at the opposite ends thereof;
   a cylindrical processing chamber communicating with said plasma generating chamber via the opening at one end of said plasma chamber;

means for evacuating said plasma generating chamber and said processing chamber;

a microwave generator for generating pulses of microwaves;

a waveguide means for transferring said pulses of microwaves through an opening at the end of said plasma chamber;

a means for supplying a gas into said plasma generating chamber;

an excitation solenoid surrounding said plasma generating chamber for generating lines of magnetic force within said plasma chamber substantially coaxially with the openings at the ends thereof for transforming said gas, by resonance effects with said microwaves, into a plasma of active atoms, molecules or ions;

support means positioned within said processing chamber for supporting a substrate to be processed in a position to be bombarded by active atoms, molecules or ions flowing out of said plasma chamber along said lines of magnetic force;

RF generating means for applying an RF bias to said substrate; and

RF generation optimizing means for applying said RF bias voltage to said substrate during periods when said microwave pulses are generated, and for maintaining the voltage of the substrate below a predetermined threshold level during intervals between said microwave pulses.

2. A plasma processing apparatus as set forth in claim 1, wherein said RF generation optimizing means comprises a synchronization pulse generating circuit for generating synchronizing signals, and a pulse signal transmitting means for transferring said synchronizing signals to said RF generating means and to said microwave generator such that said RF bias voltage is applied to said substrate in synchronism with the generation of said plasma.

3. A plasma processing apparatus as set forth in claim 1, wherein said RF generation optimizing means comprises detecting means for detecting said voltage on the substrate, an RF bias modulation circuit for comparing said voltage on the substrate with a reference voltage, and an RF ON/OFF transferring means for providing to said RF generating means a signal based on said comparison for regulating the RF bias voltage on the substrate so as to prevent the voltage on the substrate from exceeding said threshold level.

* * * * *

UNITED STATES PATENT AND TRADEMARK OFFICE
CERTIFICATE OF CORRECTION

PATENT NO. : 4,891,118
DATED : January 2, 1990
INVENTOR(S) : Ooiwa et al.

It is certified that error appears in the above-identified patent and that said Letters Patent is hereby corrected as shown below:

TITLE PAGE: Item 73, after "Japan", insert --and Fujitsu Limited, Kanagawa, Japan--;

First page, 7th line of ABSTRACT, "which" should read --with--;

Column 1, line 58, "gas a" should read --a gas--;

Column 2, line 14, "surface. When" should read --surface when--;

Column 2, line 32, "plasma is" should read --plasma are--;

Column 2, line 51, "crater" should read --craters--;

Column 4, line 23, "mean" should read --means--.

Signed and Sealed this

Fifth Day of November, 1991

Attest:

HARRY F. MANBECK, JR.

*Attesting Officer*     *Commissioner of Patents and Trademarks*